United States Patent
Hirai et al.

(10) Patent No.: US 8,421,508 B2
(45) Date of Patent: Apr. 16, 2013

(54) SPREAD SPECTRUM CLOCK GENERATOR

(75) Inventors: Kyohko Hirai, Ikeda (JP); Tohru Kanno, Kawasaki (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 13/422,131

(22) Filed: Mar. 16, 2012

(65) Prior Publication Data
US 2012/0235717 A1    Sep. 20, 2012

(30) Foreign Application Priority Data
Mar. 17, 2011 (JP) .................................. 2011-059154

(51) Int. Cl.
    *H03L 7/06* (2006.01)
(52) U.S. Cl.
    USPC ................................. 327/156; 327/163
(58) Field of Classification Search .................. None
    See application file for complete search history.

(56) References Cited

U.S. PATENT DOCUMENTS

| | | | | |
|---|---|---|---|---|
| 6,801,028 B2 * | 10/2004 | Kernahan et al. | ............. | 323/283 |
| 7,426,220 B2 * | 9/2008 | Jones | ............................ | 370/516 |
| 8,072,253 B2 * | 12/2011 | Kaeriyama et al. | ........... | 327/231 |
| 8,106,690 B2 * | 1/2012 | Sakaguchi et al. | ............ | 327/156 |
| 2009/0141774 A1 * | 6/2009 | Araki et al. | .................... | 375/130 |

FOREIGN PATENT DOCUMENTS
JP   2004-328280   11/2004
JP   2007-288375   11/2007

* cited by examiner

*Primary Examiner* — Cassandra Cox
(74) *Attorney, Agent, or Firm* — Cooper & Dunham LLP

(57) ABSTRACT

A spread spectrum clock generator includes a phase comparator to detect a phase difference between a reference input clock signal and a feedback signal and output a control voltage, a voltage controlled oscillator to generate an output clock signal with a frequency in line with the control voltage, a phase selector to select any of equally divided phases of one cycle of the output clock signal, generate and transmit a phase shift clock signal to the phase comparator as the feedback signal, and a phase controller to decide a phase of the rising edge of the phase shift clock signal and control the phase selector to select the decided phase, and generate a second phase shift amount, decide the rising edge of the phase shift clock signal to and subject the output clock signal to spread spectrum modulation by the second phase shift amount.

5 Claims, 16 Drawing Sheets

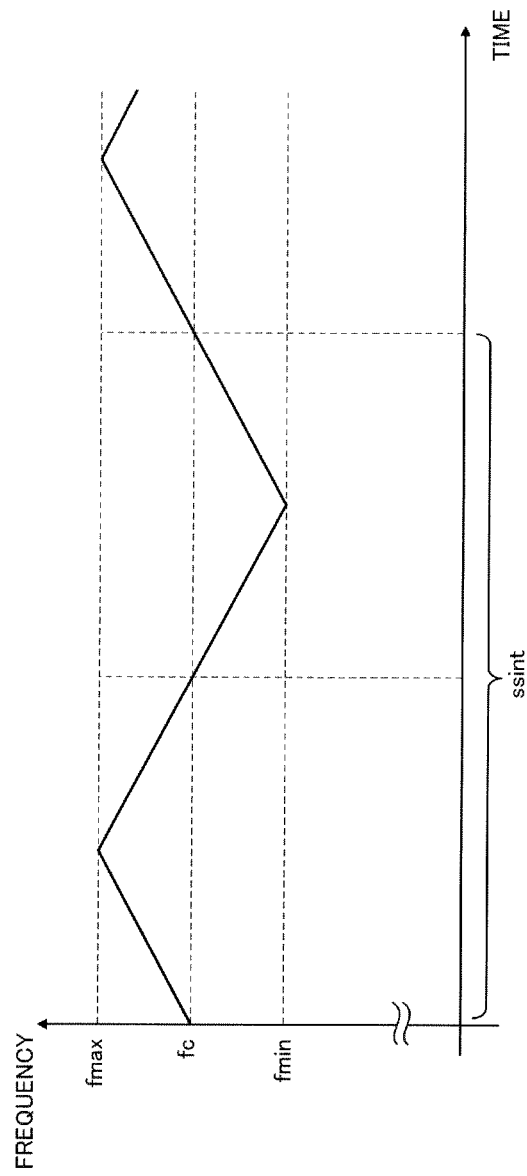

SPREAD SPECTRUM CLOCK GENERATOR

CROSS REFERENCE TO RELATED APPLICATION

The present application is based on and claims priority from Japanese Patent Application No. 2011-059154, filed on Mar. 17, 2011, the disclosure of which is hereby incorporated by reference in its entirety.

BACKGROUND OF THE INVENTION

1. Field of the Invention

The present invention relates to a spread spectrum clock generator (SSGC).

2. Description of the Related Art

In the art of a clock generator a spread spectrum clock generator (SSGC) is known. It aims to prevent electromagnetic interference (EMI) having a peak at a specific frequency by slightly modulating the frequency of a clock signal to spread the EMI energy to reduce a peak value. Japanese Patent Application Publication No. 2004-328280 and No. 2007-288375 disclose, as such an SSCG, a PLL (Phase Locked Loop) circuit or a fractional PLL circuit with a division ratio of a rational number, for example.

FIG. 17 is a block diagram of a conventional spread spectrum clock generator as a fractional PLL circuit. A reference clock signal ref_ck generated by a not-shown clock generator is divided by an input frequency divider 11 to an input clock signal comp_ck and input to a phase frequency comparator 21. The phase frequency comparator 21 detects a phase difference between the input clock signal comp_ck and a feedback signal fb_ck and outputs it to a charge pump 22. The charge pump 22 increases or decreases a charge pump voltage in accordance with the phase difference and outputs it to a loop filter 23. The loop filter 23 outputs a control voltage in accordance with the charge pump voltage to a voltage controlled oscillator (VCO) 24 which includes a V/I converter 24a to covert the control voltage to a control current, a current DA converter (IDAC) 24b to generate a control current spread-spectrum (SS) modulated under a spread spectrum controller 25, and a current controlled oscillator 24c to generate and output an output clock signal vco_ck with a frequency and a phase based on the SS modulated control current. The output clock signal vco_ck is divided for use in other circuits by an output frequency divider 12. Herein, a signal divided by the frequency divider 12 is referred to as a pixel clock signal to be used in an image processor. The output clock signal vco_ck is divided by a frequency divider 26 and input to the phase frequency comparator 21 as a feedback signal fb_ck. The division ratio of the frequency divider 26 is cyclically switched between an integer N and an integer N+1 in accordance with the count value of an accumulator 27 which counts the input clock signal comp_ck. The fractional PLL circuit performs a negative feedback control so that the feedback signal fb_ck and the input clock signal comp_ck coincide with each other in phase and frequency. Also, it realizes a decimal division ratio between the integers N and N+1 on average by switching the division ratio of the frequency divider 26.

The spread spectrum modulation of the current DA converter 24b is described with reference to FIG. 18. By SS modulation, the frequency of the output clock signal vco_ck is varied in a modulation cycle ssint over the range of a maximal value fmax and a minimal value fmin around a certain frequency fc. The modulation level ss_amp indicating a maximal variation rate of the frequency of the output clock signal vco_ck is set in the spread spectrum controller 25. The modulation level is an integer from zero to 31 and the maximal variation rate is represented by ss_amp/1,024(%). For example, at ss_amp=31, the maximal and minimal values fmax, fmin of the frequency of the output clock signal vco_ck are increased and decreased by about 3.1% from the center frequency fc, respectively. The spread spectrum controller 25 generates SS modulation waveform data ddsd_org to change the control current in the current DA converter 24b and change the frequency of the output clock signal vco_ck within the range of the maximal variation rates. The SS modulation waveform data is an integer from zero to 255 for example, and the maximal value 255 corresponds to the maximal frequency fmax, the minimal value zero corresponds to the minimal frequency fmin and the value 128 corresponds to the center frequency fc or no change in frequency.

In the following an example of calculation of the SS modulation waveform data ddsd_org when a frequency variation in the output clock signal vco_ck takes triangular waveform is described. A count value count(n) incrementing to count clocks of a pixel clock signal pix_ck is used to calculate the SS modulation waveform data ddsd_org, for example. A step size $\Delta$count of the count value, the initial value count (0), and the count value count(n) are expressed by the following equations.

$$\Delta\text{count} = 2 * 255/ss\text{int} \quad (1)$$

$$\text{count}(0) = 0 \quad (2)$$

$$\text{count}(n) = \text{count}(n-1) + \Delta\text{count}, \ 1 \leq n \leq ss\text{int}-1 \quad (3)$$

The count value count (n) increments by the step size $\Delta$count over a modulation cycle ssint. The SS modulation waveform data ddsd_org is calculated as follows:

$$\text{When } 0 \leq \text{int (count}(n)) < 128, \ \text{ddsd\_org} = 128 + \text{int (count}(n)) \quad (4)$$

$$\text{When } 128 \leq \text{int (count}(n)) < 383, \quad (5)$$
$$\text{ddsd\_org} = 255 - \{\text{int (count}(n)) - 127\} = 382 - \text{int (count}(n))$$

$$\text{When } 383 \leq \text{int (count}(n)) < 510, \quad (6)$$
$$\text{ddsd\_org} = 128 + \{\text{int (count}(n)) - (2 * 255 - 0)\} = \text{int (count}(n)) - 382,$$
$$\text{where int (count}(n)) \text{ is an integer}$$
$$\text{portion of the count value count}(n).$$

The current DA converter 24b varies the control current for the current controlled oscillator 24c on the basis of the SS modulation waveform data ddsd_org and varies the frequency of the output clock signal vco_ck within the range of the maximal variation rates represented by the modulation level ss_amp.

For the purpose of improving the amplitude accuracy of SS modulation, the current DA converter 24b can use a part of the control current of the current controlled oscillator 24c as a reference current to track the amplitude of the SS modulation waveform to the mean frequency or center frequency fc of the output clock signal vco_ck.

Thus, in the conventional SSCG the current DA converter 24b generates SS modulated control current and directly varies the oscillation frequency of the current controlled oscillator 24c by the control current. Therefore, the loop response of the PLL circuit has to be at sufficiently low speed relative to the SS modulation cycle ssint. Because of this, it faces a problem that due to the narrow bandwidth of the loop filter 23, a system correction amount to deal with a fluctuation cannot be large, which causes deterioration in jitter characteristic.

Another problem is that the conventional SSCG can vary the frequency only on a pixel clock signal basis so that fine frequency variation cannot be realized.

Another problem is that in the fractional PLL circuit phase mismatches occur in changing the division ratio of the frequency divider 26. This causes spurious components to enter the output clock signal vco_ck and deteriorate the jitter characteristic of the output clock signal vco_ck.

Furthermore, the conventional fractional PLL circuit requires a large division ratio N of the frequency divider 26 in order to increase multiplied frequency resolution, so that the frequency of the signals input to the phase frequency comparator 21 cannot be increased and the loop bandwidth of the fractional PLL circuit cannot be broadened either. This increases the phase noise in the voltage controlled oscillator 24a and degrades jitter characteristic.

SUMMARY OF INVENTION

The present invention aims to provide a spread spectrum clock generator which includes a novel fractional PLL circuit which does not operate by changing the division ratio of the frequency divider and can decrease jitters in the output clock signal.

According to one aspect of the present invention, a spread spectrum clock generator includes a phase comparator configured to detect a phase difference between a reference input clock signal and a feedback signal and output a control voltage in line with the phase difference, a voltage controlled oscillator configured to generate an output clock signal with a frequency in line with the control voltage, a phase selector configured to equally divide one cycle of the output clock signal into a predetermined number of phases and select any of the phases, generate a phase shift clock signal having a rising edge at the selected phase, and transmit the phase shift clock signal to the phase comparator as the feedback signal, a phase controller configured to decide a phase of the rising edge of the phase shift clock signal so that the phase shift clock signal has a cycle different from the cycle of the output clock signal by a first phase shift amount and control the phase selector to select the decided phase, and generate a second phase shift amount which cyclically varies in a predetermined range, decide the rising edge of the phase shift clock signal to add the second phase shift amount to the first phase shift amount and subject the output clock signal to spread spectrum modulation by the cyclically varying second phase shift amount.

BRIEF DESCRIPTION OF THE DRAWINGS

Features, embodiments, and advantages of the present invention will become apparent from the following detailed description with reference to the accompanying drawings:

FIG. 18 is a graph showing the spread spectrum modulation of a DA converter 24b in FIG. 17.

DETAILED DESCRIPTION OF PREFERRED EMBODIMENTS

Hereinafter, an embodiment of the present invention will be described in detail with reference to the accompanying drawings. Wherever possible, the same reference numbers will be used throughout the drawings to refer to the same or like parts.

First Embodiment

Figure 1:
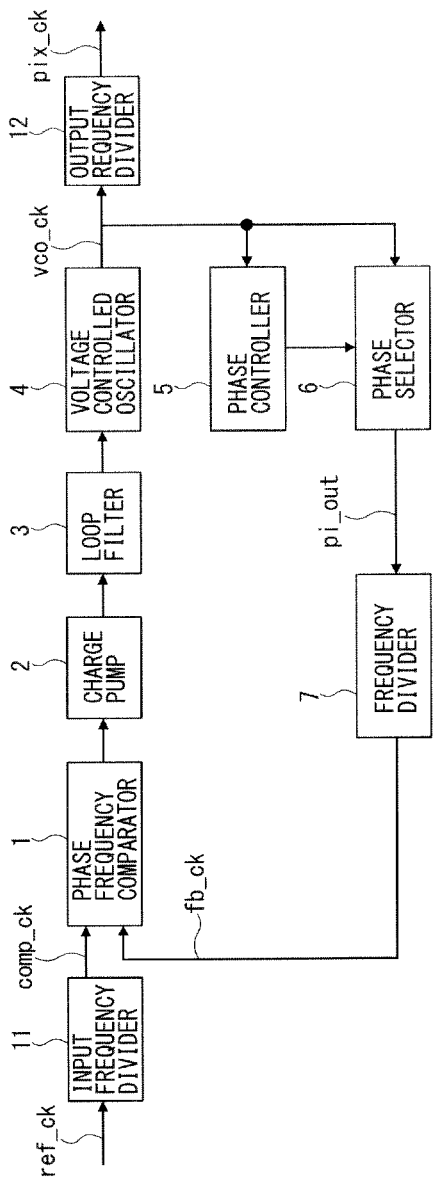
FIG. 1 is a block diagram of a spread spectrum clock generator according to a first embodiment of the present invention.

FIG. 1 is a block diagram of a spread spectrum clock generator as a fractional PLL circuit according to a first embodiment. A reference clock signal ref_ck generated by a not-shown clock generator is divided by an input frequency divider 11 to an input clock signal comp_ck and input to a phase frequency comparator 1. The phase frequency comparator 1 detects a phase difference between the input clock signal comp_ck and a feedback signal fb_ck and outputs it to a charge pump 22. The charge pump 22 increases or decreases a charge pump voltage in accordance with the phase difference and outputs it to a loop filter 23. The loop filter 23 outputs a control voltage in accordance with the charge pump voltage to a voltage controlled oscillator (VCO) 4. The voltage controlled oscillator (VCO) 4 generates and outputs an output clock signal vco_ck with a frequency and a phase in accordance with the control voltage. An output frequency divider 12 divides the output clock signal vco_ck for use in other circuits and outputs it as a pixel clock signal pix_ck. A phase selector 6 to operate under the control of a phase controller 5 and a frequency divider 7 with division ratio of a fixed integer are provided in a feedback circuit from the voltage controlled oscillator 4 to the phase frequency comparator 1. The phase selector 6 changes the phase of the rising edge of the output clock signal vco_ck to generate a phase shift clock signal pi_out with a different cycle of that of the output clock signal vco_ck. Specifically, the phase selector 6 equally divides one cycle of the output clock signal vco_ck into a predetermined number of phases and selects one of them to generate and output a phase shift clock signal pi_out having a rising edge at the selected phase. The phase controller 5 decides the phase of a rising edge of the phase shift clock signal pi_out to control the phase selector 6 so that the cycle of the phase shift clock signal pi_out coincides with one different from that of the output clock signal vco_ck by a predetermined phase shift amount $\Delta$ph or an integral multiple of the equally divided phase. The frequency divider 7 divides the phase shift clock signal pi_out and outputs it to the phase frequency comparator 1 as a feedback signal fb_ck.

The fractional PLL circuit of the SSCG according to the present embodiment performs a negative feedback control so that the feedback signal fb_ck and the input clock signal comp_ck coincide with each other in phase and frequency. It can also realize a division ratio of rational number by generating the phase shift clock signal pi_out with a different cycle from that of the output clock signal vco_ck with the phase selector 6. At a positive phase shift amount $\Delta$ph, the feedback signal fb_ck is higher in frequency than the input clock signal comp_ck while at a negative phase shift amount $\Delta$ph, the feedback signal fb_ck is lower in frequency than the input clock signal comp_ck. Furthermore, the SSCG according to the present embodiment can SS-modulate the frequency of the output clock signal vco_ck by changing the cycle of the phase shift clock signal pi_out with the phase selector 6.

The phase selector 6 can further divide the output clock signal vco_ck in generating the phase shift clock signal pi_out with a different cycle from that of the output clock signal vco_ck. Herein, a set value of the division ratio of the phase selector 6 is represented by div_puck=0, 1, 2, . . . and when div_puck=n, the division ratio of the output clock signal is assumed to be n+1. With the frequency divider 12 having a division ratio of 2 or more, the phase selector 6 further divides the output clock signal vco_ck with the division ratio taken into account. Likewise, a set value of the division ratio of the output frequency divider 12 is represented by div_pll=0, 1, 2, . . . and when div_pll=n, the division ratio of the output clock signal is assumed to be n+1. A set value of the division ratio of the frequency divider 7 is represented by div_fb=0, 1, 2, . . . and when div_fb=n, the division ratio is assumed to be n+1. Thus, the division ratio of the feedback signal fb_ck relative to the output clock signal vco_ck is obtained by multiplying the division ratios of the phase selector 6, the frequency divider 12, and the frequency divider 7.

The output frequency divider 12 generates an output clock signal vco_ck with a frequency of 60 to 120 MHz and a pixel clock signal pix_ck with a frequency of 5 to 40 MHz, for example.

Figure 2:
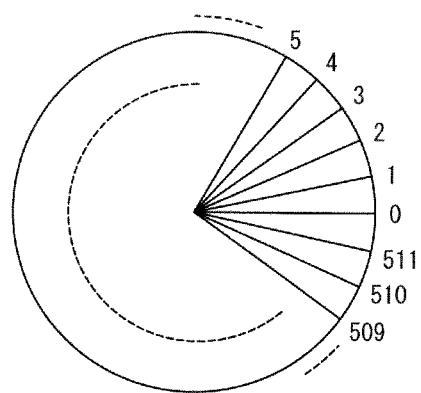
FIG. 2 shows the phases of an output clock signal vco_ck selected by a phase selector 6 in FIG. 1.
Figure 3:
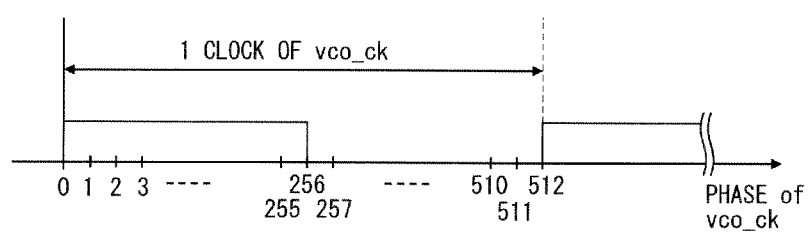
FIG. 3 shows the phases of the output clock signal vco_ck selected by a phase selector 6 in FIG. 1.

FIGS. 2, 3 show the phase of the output clock signal vco_ck selected by the phase selector 6. The phase selector 6 is configured to equally divide one cycle of the output clock signal vco_ck into 512 phases (0 to 511 in FIGS. 2-3) and select any of them. The phase selector 6 functions as a phase interpolator to interpolate the rising edge at an arbitrary phase.

Next, referring to FIG. 4 to FIG. 7, the operation of the SSCG as a fractional PLL circuit is described in detail. For the sake of simplicity, the division ratios of the phase selector 6, output frequency divider 12, and frequency divider 7 are assumed to be all set to 1, that is, div_puck=0, div_fb=0, div_pll=0.

Figure 4:
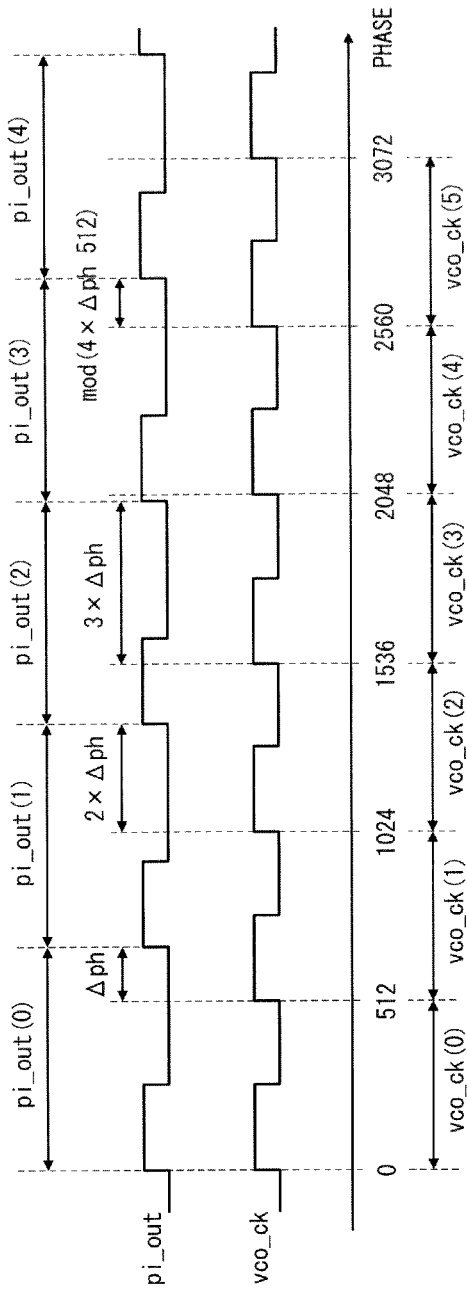
FIG. 4 is a timing chart for a phase shift of the phase selector 6 in FIG. 1 when a phase shift amount Δph is positive.

FIG. 4 is a timing chart for a phase shift of the phase selector 6 in FIG. 1 when a phase shift amount $\Delta$ph is positive. The unit of phase is one obtained by dividing one cycle of the output clock signal vco_ck into 512 in FIGS. 4 to 11. In FIG. 4 the cycle of the phase shift clock signal pi_out is increased from that of the output clock signal vco_ck by a phase shift amount $\Delta$ph, that is, 512+$\Delta$ph. Thus, the rising edge of each clock of the phase shift clock signal pi_out delays from that of the output clock signal vco_ck by the phase shift amount $\Delta$ph and the phase shift amount $\Delta$ph increments as the clock counts up. The rising edges of the initial clocks vco_ck(0) and pi_out(0) of the two signals are assumed to coincide with each other. The rising edge of the second clock pi_out(1) delays from that of the second clock vco_ck(1) by the phase shift amount $\Delta$ph and that of the third clock pi_out(2) delays from that of the third clock vco_ck(2) by twice the phase shift amount $\Delta$ph. Thus, the rising edge of the n-th clock pi_out (n−1) of the phase shift clock signal delays from that of the n-th clock vco_ck(n−1) of the output clock signal by n−1 times the phase shift amount $\Delta$ph.

Figure 5:
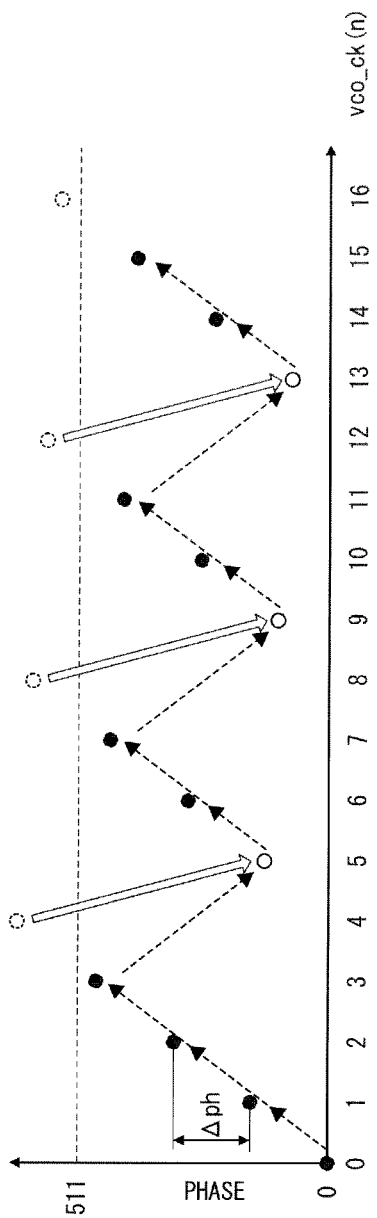
FIG. 5 is a graph showing the phase selected by the phase selector 6 for the phase shift in FIG. 4.

FIG. 5 is a graph showing the phases selected by the phase selector 6 for the phase shift in FIG. 4. The phase selector 6 selects any one of the 512 divided phases 0 to 511 as a current phase. As shown in FIG. 5, it selects a new current phase with an increment of the phase shift amount $\Delta$ph as the clock of the output clock signal vco_ck counts up. The rising edges of the initial clocks vco_ck(0) and pi_out(0) of the two signals are assumed to coincide with each other. When the sum of the incremented phase amount and the current phase is smaller than the one cycle of the output clock signal vco_ck or 511, the rising edge of the next clock of the phase shift clock signal pi_out will be at a phase within the next clock cycle of the output clock signal vco_ck. On the other hand, when the sum of the incremented phase amount and the current phase is larger than the one cycle of the output clock signal vco_ck or 512, the rising edge of the next clock of the phase shift clock signal pi_out will be at a phase not in the next clock cycle but in the second next clock cycle of the output clock signal vco_ck reduced by 512 from the incremented phase. For the latter, for example, the rising edge of the fifth clock pi_out(4) is not in that of the fifth clock vco_ck(4) but in the sixth clock vco_ck(5) as shown in FIG. 4 and delays from that of the sixth clock vco_ck(5) by a remainder of the division of 4×$\Delta$ph by 512 or mod(4×$\Delta$ph,512). FIG. 5 shows that the phases indicated by solid white circles and outline arrows are selected instead of the phases indicated by broken circles at the clocks vco_ck(4), vco_ck(8), vco_ck(12) of the output clock signal.

Thus, by selecting the phases in the above manner, each clock cycle pi_out(n) of the phase shift clock signal is constantly set to a length of the cycle of the output clock signal vco_ck plus the phase shift amount $\Delta$ph or 512+$\Delta$ph.

Figure 6:
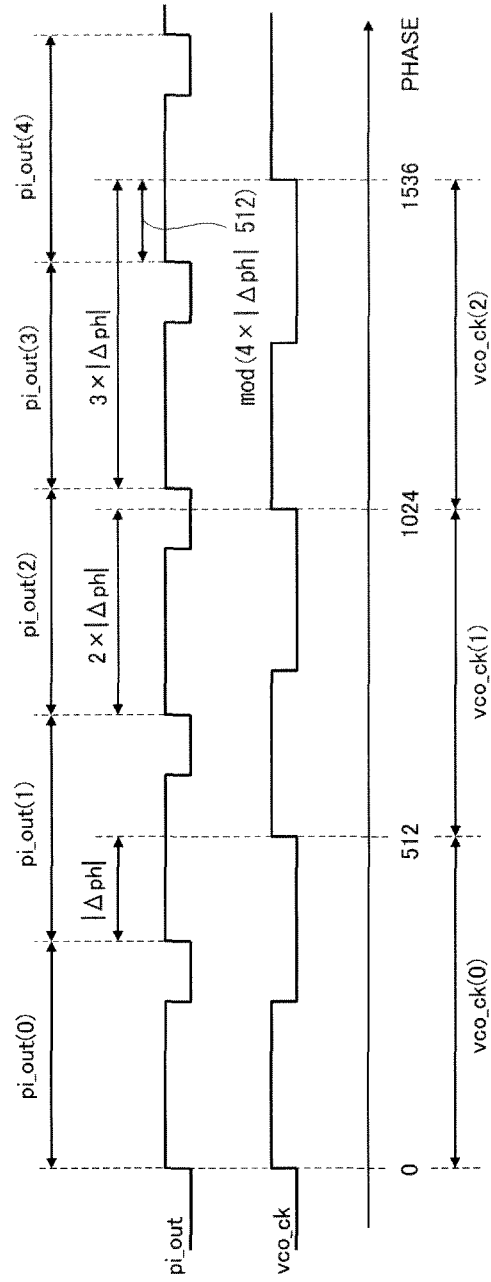
FIG. 6 is a timing chart for the phase shift of the phase selector 6 in FIG. 1 when a phase shift amount Δph is negative.

FIG. 6 is a timing chart for the phase shift of the phase selector 6 in FIG. 1 when a phase shift amount $\Delta$ph is negative. The cycle of the phase shift clock signal pi_out is reduced from that of the output clock signal by the phase shift amount |$\Delta$ph|, that is, 512−|$\Delta$ph|. Therefore, the rising edge of each clock of the phase shift clock signal pi_out advances from that of each clock of the output clock signal vco_ck and the advance amount increments by the phase shift amount |$\Delta$ph| as the clock of the output clock signal vco_ck counts up. The rising edges of the initial clocks vco_ck(0) and pi_out(0) of the two signals are assumed to coincide with each other. The rising edge of the second clock pi_out(1) advances from that of the second clock vco_ck(1) by the phase shift amount |$\Delta$ph| and that of the third clock pi_out(2) advances from that of the third clock vco_ck(2) by twice the phase shift amount |$\Delta$ph|. Thus, the rising edge of the n-th clock pi_out(n−1) of the phase shift clock signal advances from that of the n-th clock vco_ck(n−1) of the output clock signal by n−1 times the phase shift amount |$\Delta$ph|.

Figure 7:
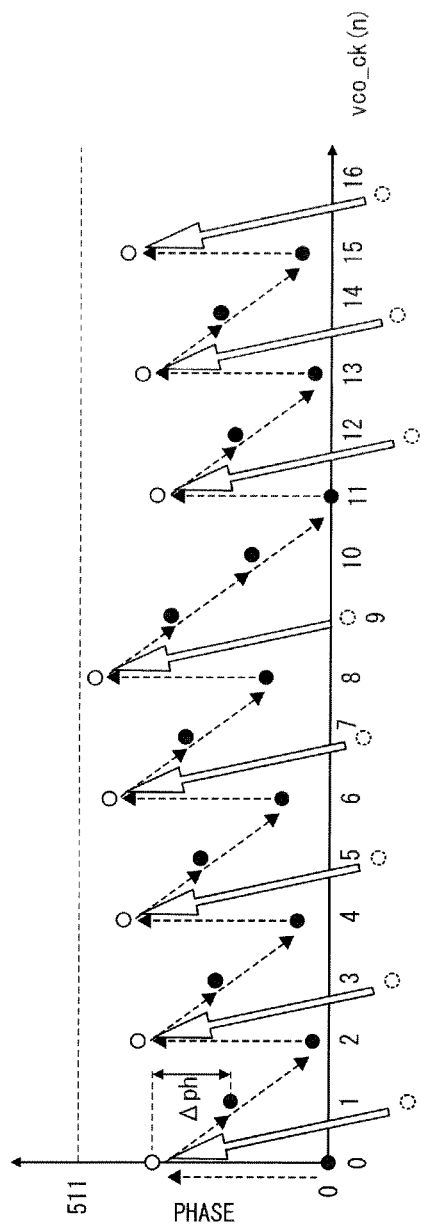
FIG. 7 is a graph showing the phase selected by the phase selector 6 for the phase shift in FIG. 6.

FIG. 7 is a graph showing the phases selected by the phase selector 6 for the phase shift in FIG. 6. As shown in FIG. 7, it selects a phase with the phase shift amount |$\Delta$ph| which decrements as the clock of the output clock signal vco_ck counts up. When the decremented phase is not negative, the rising edge of the next clock of the phase shift clock signal pi_out will be at a phase within the next clock cycle of output clock signal vco_ck. On the other hand, when the decremented phase is negative, the rising edge of the next clock of the phase shift clock signal pi_out will be at a phase not in the next clock cycle but in the current clock cycle of the output clock signal vco_ck added by 512 to the decremented phase. For the latter, for example, the rising edge of the fifth clock pi_out(4) is not in that of the fourth clock vco_ck(3) but in the third clock vco_ck(2) as shown in FIG. 6 and advances from that of the fourth clock vco_ck(3) by a remainder of the division of 4*|Δph| by 512 or mod(4*|Δph|,512). FIG. 7 shows that the phases indicated by solid white circles and outline arrows are selected instead of the phases indicated by broken circles at the clocks vco_ck(1), vco_ck(3), . . . of the output clock signal.

Thus, by selecting the phases in the above manner, each clock cycle pi_out(n) of the phase shift clock signal is constantly set to a length subtracted from the cycle of the output clock signal vco_ck by the phase shift amount Δph or 512−|Δph|.

As shown in FIG. 4 to FIG. 7, the phase controller 5 is configured to decide the phase of the rising edge of the phase shift clock signal pi_out and control the phase selector 6 to operate in accordance with the decided phase.

The frequency fpi_out of the phase shift clock signal pi_out is expressed by the following equation (7);

$$fpi\_out=fvco\_ck*512/(512+\Delta ph),$$

where fvco_ck is the frequency of the output clock signal vco_ck.

Since the fractional PLL circuit according to the present embodiment performs a feedback control so that the frequencies and phases of the feedback signal fb_ck and input clock signal comp_ck coincide with each other. Accordingly, the relation between the two signals is expressed by the following equations:

$$ffb\_ck=fpi\_out=fcomp\_ck \quad (8)$$

$$fcomp\_ck=fvco\_ck*512/(512+\Delta ph) \quad (9)$$

$$fvco\_ck=fcomp\_ck*(1+\Delta ph/512) \quad (10)$$

where fcomp_ck is the frequency of the input clock signal comp_ck and ffb_ck is the frequency of the feedback signal fb_ck.

The SSCG including the fractional PLL circuit according to the present embodiment can achieve an extremely small multiple rate such as 1.0% or less owing to an improved resolution of the phase selector 6. In the present embodiment the minimal multiple rate is such that 1/512≈0.002=0.2%.

Second Embodiment

Next, referring to FIG. 8 to FIG. 11, the SSCG's operation when any of the respective division ratios div_puck, div_fb, div_pll of the phase selector 6, output frequency divider 12, and frequency divider 7 is 1 or more is described. In the drawings a set value div_puck of the phase selector 6 is 2 and the division ratio thereof is 3.

Figure 8:
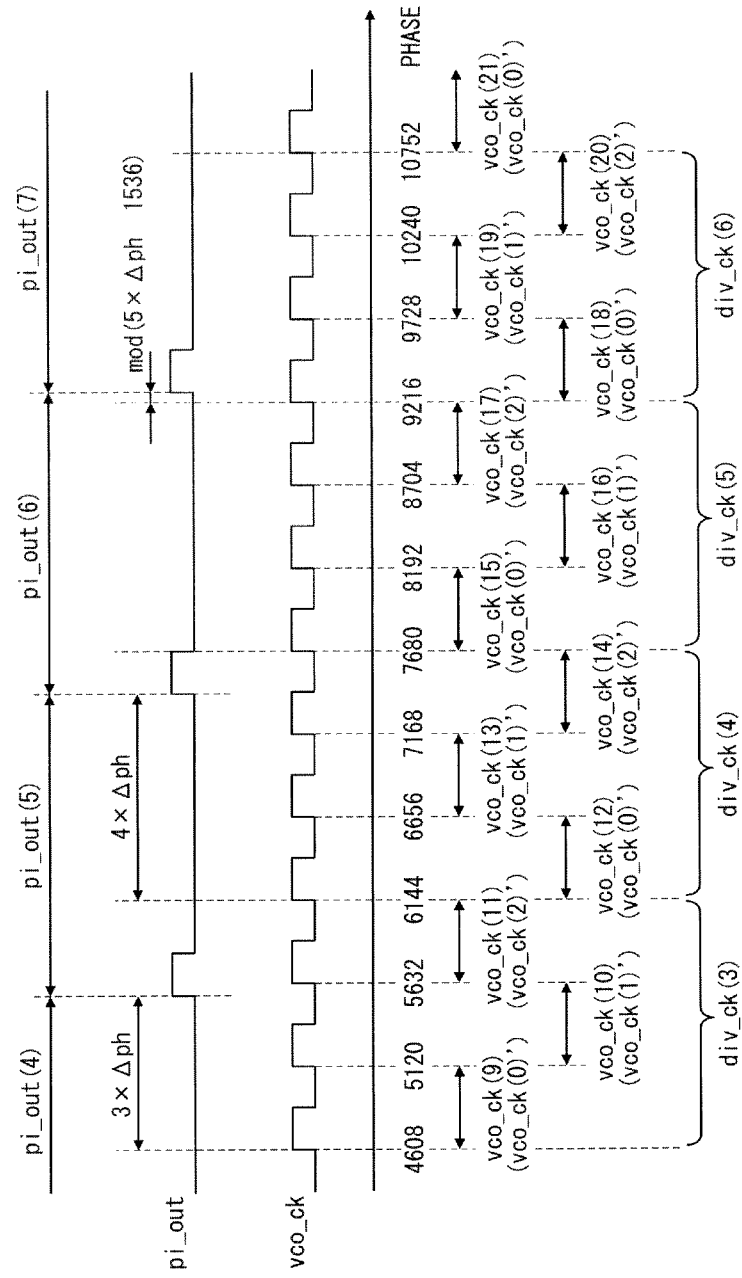
FIG. 8 is a timing chart for the phase shift of the phase selector 6 of a spread spectrum clock generator according to a second embodiment of the present invention when a phase shift amount Δph is positive.

FIG. 8 is a timing chart for the phase shift of the phase selector 6 of the spread spectrum clock generator according to a second embodiment of the present invention when a phase shift amount Δph is positive. The output clock signal vco_ck is divided by the phase selector 6 at every three clocks to clock signals div_ck. For example, the tenth to twelfth clocks vco_ck(9), vco_ck(10), vco_ck(11) of the output clock signal become the fourth clock div_ck(3) of the divided clock signal. Each clock of the output clock signal vco_ck is divided into three sub clocks vco_ck(0)', vco_ck(1)', vco_ck(2)'. In FIG. 8 the cycle of the phase shift clock signal pi_out is increased by the phase shift amount Δph from that of the three clocks of the output clock signal vco_ck or that of the divided clock signal div_ck, that is, 512*3+Δph. The rising edge of each clock of the phase shift clock signal pi_out delays by an increment of the phase shift amount Δph from that after the third clock of the output clock signal vco_ck or the head of the divided clock signal div_ck. The rising edges of the initial clocks vco_ck(0), pi_out(0) of the output clock signal and phase shift clock signal are assumed to coincide with each other. The rising edge of the second clock pi_out(1) delays from that of the fourth clock vco_ck(3) by the phase shift amount Δph and that of the third clock pi_out(2) delays from that of the seventh clock vco_ck(6) by twice the phase shift amount Δph. Thus, the rising edge of the n-th clock pi_out(n−1) of the phase shift clock signal delays from that of the 3n−2th clock vco_ck(3n-3) of the output clock signal by n−1 times the phase shift amount Δph.

Figure 9:
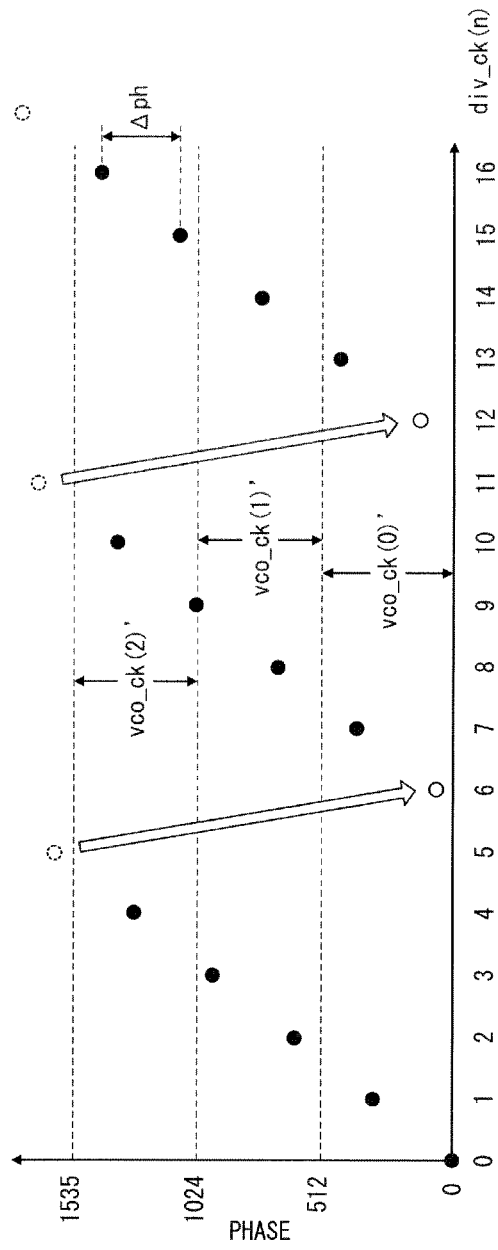
FIG. 9 is a graph showing the phase selected by the phase selector 6 for the phase shift in FIG. 8.

FIG. 9 is a graph showing the phase selected by the phase selector 6 for the phase shift in FIG. 8. The phase selector 6 is configured to equally divide the cycle of the divided clock signal div_ck into 1,536 phases 0 to 1,535 and select any of them as a current phase, which is virtually the same as the selection from the phases 0 to 511 in FIG. 2 and FIG. 3. As shown in FIG. 9, it selects, as a new current phase, one with an increment of the phase shift amount Δph as the clock of the output clock signal vco_ck counts up. When the sum of the incremented phase amount and the current phase is smaller than the one cycle of the divided clock signal div_ck or 1,535, the rising edge of the next clock of the phase shift clock signal pi_out will be at a phase within the next clock cycle of the clock signal dic_ck. On the other hand, when the sum of the incremented phase amount and the current phase is larger than the one cycle of the divided clock signal vco_ck or 1,535, the rising edge of the next clock of the phase shift clock signal pi_out will be at a phase in the cycle two clocks after the divided clock signal div_ck reduced by 1,536 from the incremented phase. For the latter, for example, the rising edge of the eighth clock pi_out(7) is in the cycle of the seventh clock div_ck(6) of the divided clock signal as shown in FIG. 8 and delays from that of the seventh clock vco_ck(6) by a remainder of the division of 5*Δph by 1,536 or mod(5*Δph,1,536).

Thus, by selecting the phases in the above manner, each clock cycle pi_out(n) of the phase shift clock signal is constantly set to a length of the three clocks of the output clock signal vco_ck plus the phase shift amount Δph or 512*3+Δph.

Figure 10:
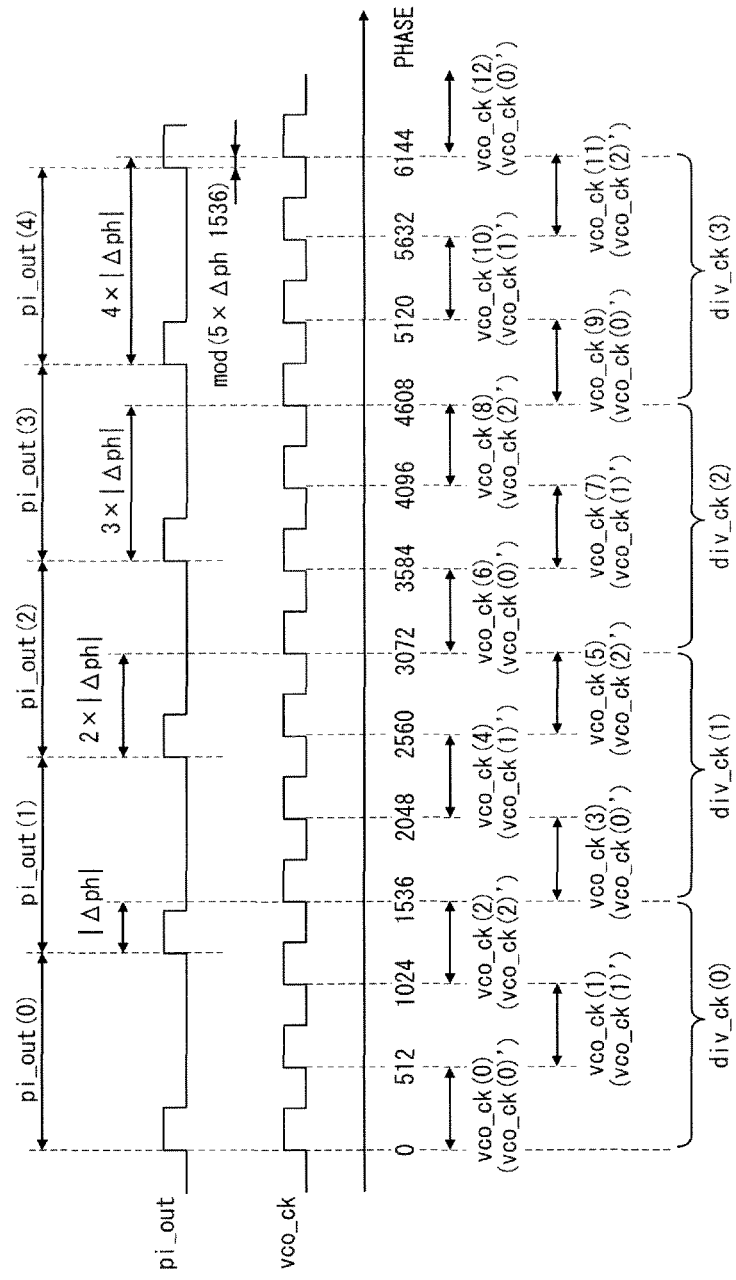
FIG. 10 is a timing chart for the phase shift of the phase selector 6 according to the second embodiment when a phase shift amount Δph is negative.

FIG. 10 is a timing chart for the phase shift of the phase selector 6 of the spread spectrum clock generator according to the second embodiment of the present invention when the phase shift amount Δph is negative. In FIG. 10 the cycle of the phase shift clock signal pi_out is decreased by the phase shift amount Δph from that of the three clocks of the output clock signal vco_ck or that of the divided clock signal div_ck, that is, 512*3−1|Δph|. The rising edge of each clock of the phase shift clock signal pi_out advances by an increment of the phase shift amount |Δph| from that after the third clock of the output clock signal vco_ck or the head of the divided clock signal div_ck. The rising edges of the initial clocks vco_ck (0), pi_out(0) of the output clock signal and phase shift clock signal are assumed to coincide with each other. The rising edge of the second clock pi_out(1) advances from that of the fourth clock vco_ck(3) by the phase shift amount |Δph| and that of the third clock pi_out(2) advances from that of the seventh clock vco_ck(6) by twice the phase shift amount |Δph|. Thus, the rising edge of the n-th clock pi_out(n−1) of the phase shift clock signal advances from that of the 3n−2th clock vco_ck(3n−3) of the output clock signal by n−1 times the phase shift amount |Δph|.

Figure 11:
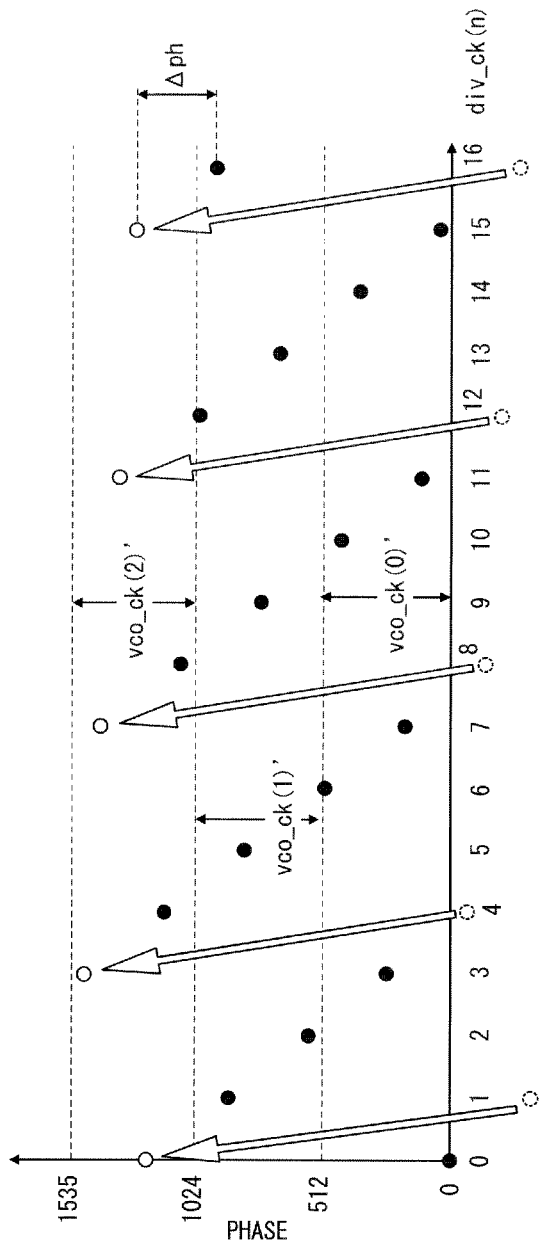
FIG. 11 is a graph showing the phase selected by the phase selector 6 for the phase shift in FIG. 10.

FIG. 11 is a graph showing the phase selected by the phase selector 6 for the phase shift in FIG. 10. The phase selector 6 is configured to select a new phase with a decrement of the phase shift amount |Δph| as the clock of the output clock signal vco_ck counts up as shown in FIG. 9. When the decremented phase is not negative, the rising edge of the next clock of the phase shift clock signal pi_out will be at a phase within the next clock cycle of the divided clock signal div_ck. On the other hand, when the decremented phase is negative, the rising edge of the next clock of the phase shift clock signal pi_out will be at a phase in the current clock of the divided clock signal div_ck added by 1,536 to the decremented phase. For the latter, for example, the rising edge of the sixth clock pi_out(5) is in the cycle of the fourth clock div_ck(3) of the divided clock signal as shown in FIG. 10 and advances from that of the fifth clock vco_ck(4) by a remainder of the division of 5*|Δph| by 1,536 or mod(5*|Δph|,1,536).

Thus, by selecting the phases in the above manner, each clock cycle pi_out(n) of the phase shift clock signal is constantly set to a length subtracted from the cycle of the three clocks of the output clock signal vco_ck by the phase shift amount |Δph| or 512*3−|Δph|.

The phase controller 5 is configured to decide the phase of the rising edge of the phase shift clock signal pi_out and control the phase selector 6 to operate in accordance with the decided phase, as shown in FIG. 8 to FIG. 11.

When any of the respective division ratios div_puck, div_fb, div_pll is 1 or more as in FIGS. 8 to 11, the equation (7) is changed to the following equations:

$$f\text{pi\_out} = f\text{vco\_ck} * 512/\{512*(\text{div\_pll}+1)*(\text{div\_puck}+1)*\Delta\text{ph}\} \quad (11)$$

$$f\text{comp\_ck} = f\text{fb\_ck} = f\text{pi\_out}/([\text{div\_fb}]+1) = f\text{vco\_ck}*512/ \quad (12)$$
$$[\{512*(\text{div\_pll}+1)*(\text{div\_puck}+1)+\Delta\text{ph}\}*([\text{div\_fb}]+1)]$$

$$f\text{vco\_ck} = f\text{comp\_ck}*(\text{div\_fb}+1)* \quad (13)$$
$$\{512*(\text{div\_pll}+1)*(\text{div\_puck}+1)+\Delta\text{ph}\}/512 = f\text{compck}*$$
$$(\text{div\_fb}+1)*\{(\text{div\_pll}+1)*(\text{div\_puck}+1)+\Delta\text{ph}/512\} =$$
$$f\text{comp\_ck} \times \{(\text{div\_fb}+1) \times (\text{div\_pll}+1) \times (\text{div\_puck}+1) +$$
$$(\text{div\_fb}+1) \times \Delta\text{ph}/512\}$$

Thus, the SSCG including the fractional PLL circuit according to the second embodiment can achieve a smaller multiple rate by the division of the phase selector 6. The minimal multiple rate (%) is expressed by the following equation (14):

$$([\text{div\_fb}]+1)*\Delta\text{ph}/512 \approx 0.002*([\text{div\_fb}]+1) = 0.2*([\text{div\_fb}]+1)$$

The minimal unit of a variation of the frequency of the output clock signal vco_ck is expressed by the following equation (15):

$$\Delta f\text{vco\_ck}/f\text{vco\_ck} = \{(\text{div\_pll}+1)*(\text{div\_puck}+1)+\Delta\text{ph}/512\}/$$
$$\{(\text{div\_pll}+1) \times (\text{div\_puck}+1)+0/512\} =$$

$$1 + \Delta\text{ph}/\{512*(\text{div\_pll}+1)*(\text{div\_puck}+1)\} \approx$$
$$1 + 0.002/\{(\text{div\_pll}+1)*(\text{div\_puck}+1)\}$$

As described above, during the operation of the SSCG, the division ratio of the frequency divider 7 is fixed and the frequencies of the phase shift clock signal pi_out and the feedback signal fb_ck are constant. This accordingly makes it possible to resolve phase mismatching of the phase frequency comparator 1 which would occur when the division ratio of the frequency divider is changed. This further results in preventing spurious components to enter the output clock signal vco_ck and reducing jitter therein. Moreover, the division ratio of the frequency divider 7 can be made smaller owing to the improved resolution of the phase selector 6. As a result, the loop bandwidth of the fractional PLL circuit can be widened to reduce jitter in the output clock signal vco_ck. Thus, it is possible to provide an SSCG having a novel fractional PLL circuit which does not operate by changing the division ratio of the frequency divider.

In the following the SS modulation of the phase selector 6 is described with reference to FIGS. 12 to 13.

Figure 12:
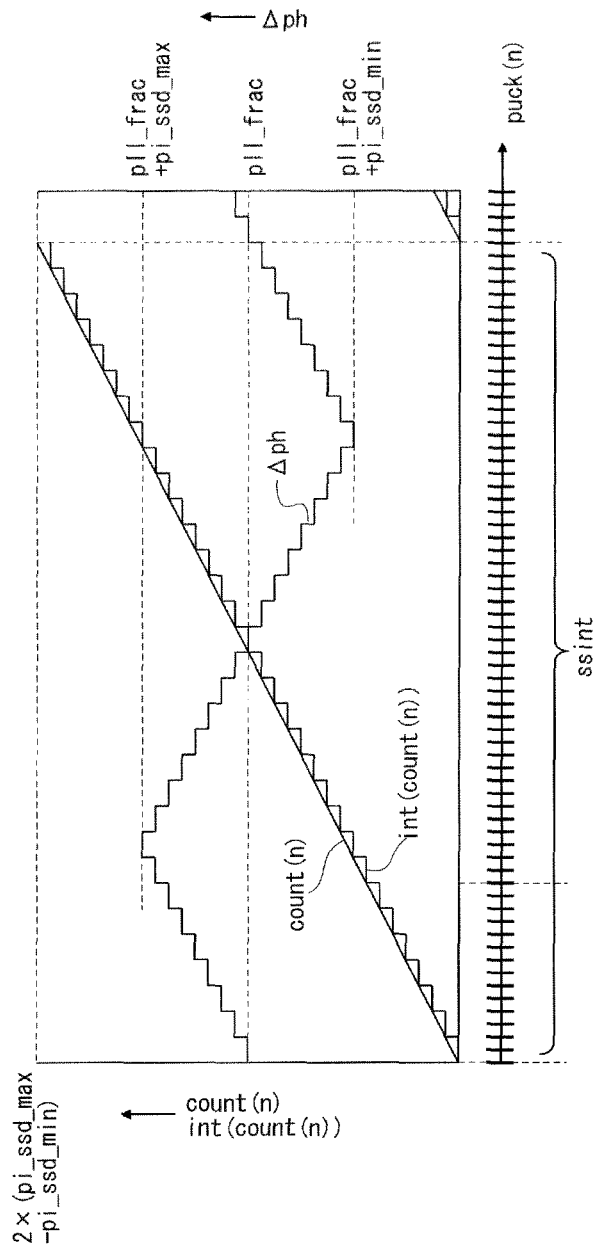
FIG. 12 shows the spread spectrum modulation of the phase selector 6.

FIG. 12 shows the spread spectrum modulation of the phase selector 6. FIG. 13 is an enlarged view of a variation in the phase shift amount Δph in FIG. 12. The SSCG including the fractional PLL circuit is configured to vary the cycle of the phase shift clock signal pi_out from that of the output clock signal vco_ck by the phase shift amount Δph as in FIG. 4 to FIG. 11. Here, the center of the phase shift amount Δph is referred to as a first phase shift amount pll_frac, and the cycle of the phase shift clock signal pi_out is varied by the first phase shift amount pll_frac and a second phase shift amount pi_ssd to conduct the SS modulation to the output clock signal vco_ck. The frequency of the output clock signal vco_ck fluctuates in a triangular waveform as in FIG. 18 in accordance with the division ratios div_puck, div_fb, div_pll of the phase selector 6, output frequency divider 12, and frequency divider 7, modulation level ss_amp, and modulation cycle ssint.

First, the minimal unit of time in which the phase shift amount Δph is varied for SS modulation is set to modulation clock puck(0), puck(1), ... puck(n). The modulation clock puck(n) is obtained by dividing the clock of the output clock signal vco_ck by the division ratios of the output frequency divider 12 and the phase selector 6. The frequency fpuck of the modulation clock puck(n) is expressed by the following equation:

$$f\text{puck} = f\text{pix\_ck}/(\text{div\_puck}+1) \quad (16)$$

$$f\text{pix\_ck} = f\text{vco\_ck}/(\text{div\_pll}+1) \quad (17)$$

As shown in FIG. 12, the phase shift amount Δph is varied stepwise by a step size Δθ with an interval including the predetermined number of modulation clocks puck(n) so that it is approximately varied in a triangular wave. The interval is referred to as step interval step_p. The number of modulation clocks puck(n) in each step interval step_p differs depending on the setting.

Next, the maximal value pi_ssd_max and minimal value pi_ssd_min of the second phase shift amount pi_ssd are calculated by the following equations:

$$\text{pi\_ssd\_max} = \text{int}([\text{ss\_amp}]/1024/\Delta f\_\text{step}) \quad (18)$$

-continued $$pi\_ssd\_min = -int([ss\_amp]/1024/\Delta f\_step) \quad (19)$$

$$\Delta f\_step = \Delta fvco\_ck/fvco\_ck - 1 \quad (20)$$
$$= 1/512/\{(div\_pll+1)*(div\_puck+1)\}$$

The modulation level ss_amp is defined same as in prior art.

To calculate the second phase shift amount pi_ssd, a count value count(n) incrementing at each modulation clock is introduced. The count value count(n) and the step size Δcount are represented by, for example, a decimal number including a 9-bit integer portion and a 16-bit decimal portion. The step size Δcount, the initial value count(0) of the count value and the count value count(n) are expressed by the following equations, respectively:

$$\Delta count = 2*(pi\_ssd\_max - pi\_ssd\_min)/ssint \quad (21)$$

$$count(0) = 0 \quad (22)$$

$$count(n) = count(n-1) + \Delta count, \ 1 \leq n \leq ssint-1 \quad (23)$$

The count value count(n) is incremented by the step size Δcount over the modulation cycle ssint. The second phase shift amount pi_ssd is calculated by the following equation:

$$pi\_ssd = int(count(n)) \ when \ 0 \leq int(count(n)) < pi\_ssd\_max + 1 \quad (24)$$

$$pi\_ssd = \quad (25)$$
$$pi\_ssd\_max - \{int(count(n)) - pi\_ssd\_max\} \ when \ pi\_ssd\_max + 1 \leq$$
$$int(count(n)) < pi\_ssd\_max + 1 + (pi\_ssd\_max - pi\_ssd\_min)$$

$$pi\_ssd = \quad (26)$$
$$pi\_ssd\_min + \{int(count(n)) - (2*pi\_ssd\_max - pi\_ssd\_min)\}$$
$$when \ pi\_ssd\_max + 1 + (pi\_ssd\_max - pi\_ssd\_min) \leq$$
$$int \ and(count(n)) < 2*(pi\_ssd\_max - pi\_ssd\_min)$$

The phase shift amount Δph of the phase selector 6 is found by adding the second phase shift amount pi_ssd to the first phase shift amount pll_frac, that is, by the following equation (27):

$$\Delta ph = pll\_frac + pi\_ssd$$

According to the spread spectrum clock generator, the frequency of the output clock signal vco_ck can be varied as shown in FIG. 18 by changing the phase shift amount Δph. The frequency fvco_ck of the output clock signal vco_ck increases as the phase shift amount Δph increases while it decreases as the phase shift amount Δph decreases.

Figure 13:
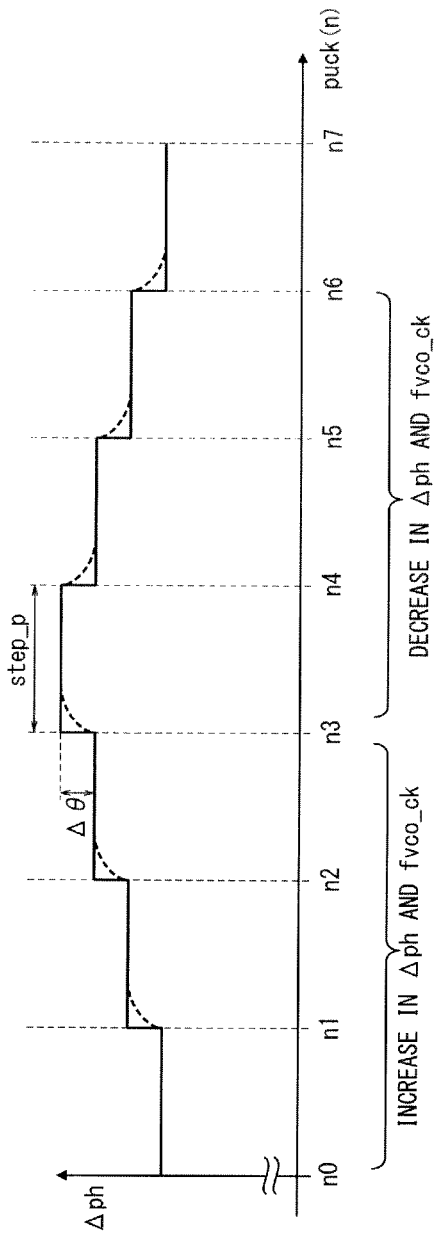
FIG. 13 is an enlarged view of a variation in the phase shift amount Δph in FIG. 12.

When the phase shift amount Δph is changed as indicated by the solid line in FIG. 13, the frequency of the output clock signal vco_ck is actually varied as indicated by the broken line in FIG. 13 due to a response delay of the SSCG.

The response characteristics of the loop of the fractional PLL circuit have to be sufficiently fast relative to the frequency of the SS modulation. Also, the SS modulation frequency can be about 10 to 50 kHz when the frequency of the output clock signal vco_ck is in the order of 100 MHz, for example.

Third Embodiment

Figure 14:
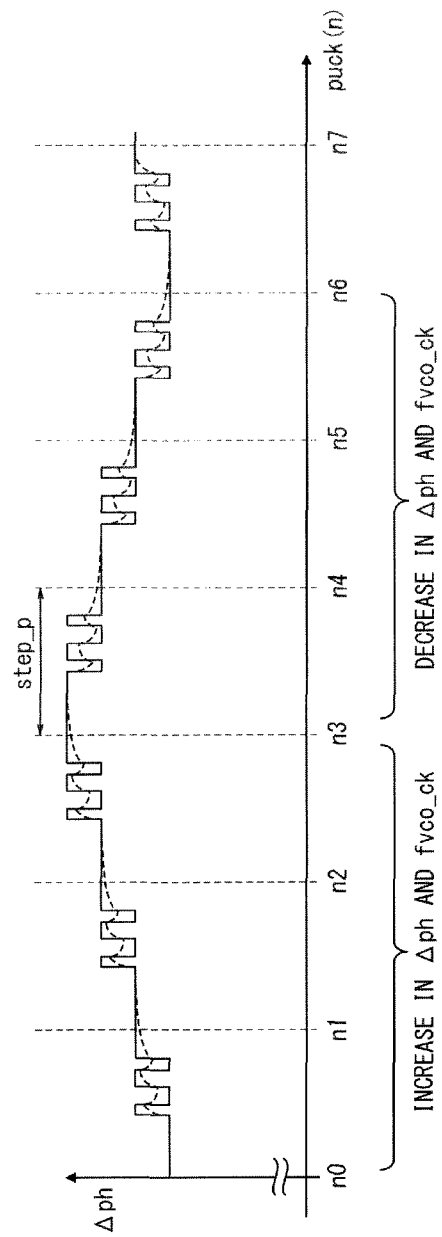
FIG. 14 shows the spread spectrum modulation of the phase selector according to a third embodiment.

FIG. 14 shows the spread spectrum modulation of the phase selector of the SSCG according to a third embodiment. The structure of the SSCG is the same as that of the SSCG in FIG. 1. In the present embodiment the SSCG is configured to compensate the coarseness of the frequency step of the SS modulation of the output clock signal vco_ck which may occur when a set value div_puck of the division ratio of the phase selector 6 is small and the minimal multiple rate of the frequency is large. This problem occurs because the resolution of the SS modulation depends on the division ratio of the phase selector 6 in the SSCG.

Referring to FIG. 14, the phase selector 6 is configured to change the phase shift amount Δph so that it gradually increases, by repeatedly switching the phase shift amounts before and after the change. In other words, the phase selector 6 modulates the step width for changing the phase shift amount Δph.

Figure 15:
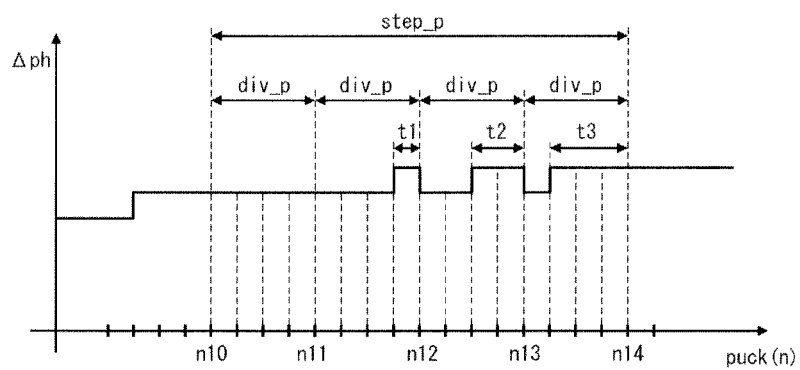
FIG. 15 is an enlarged view of an increase in the phase shift amount Δph in FIG. 14.

FIG. 15 is an enlarged view of an increase in the phase shift amount Δph in FIG. 14 for example. In FIG. 15 a single step interval step_p includes 16 modulation clocks puck(n) and is divided into 4 sub step intervals div_p each including 4 modulation clocks puck(n). The phase selector 6 repeatedly switches the phase shift amounts Δph before and after the change so that the phase shift amount Δph increases gradually as indicated by the time t1, t2, t3 in the drawing. During the first sub step interval div_p the phase shift amount Δph is not changed. During the second sub step interval div_p it is not changed from the first to the third modulation clocks puck(n) but is changed at the fourth modulation clock puck(n). During the third sub step interval div_p the phase shift amount is not changed at the first and second modulation clocks puck(n) and changed at the third and fourth modulation clocks puck (n). During the fourth sub step interval div_p the phase shift amount Δph is not changed at the first modulation clock puck(n) and changed at the second to fourth modulation clocks puck(n).

Figure 16:
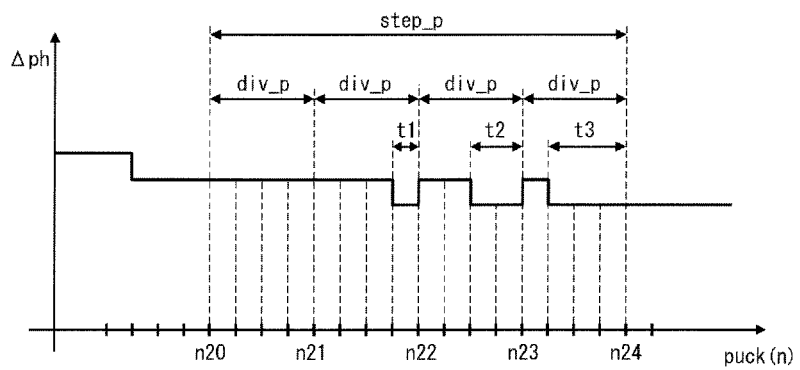
FIG. 16 is an enlarged view of a decrease in the phase shift amount Δph in FIG. 14.
Figure 17:
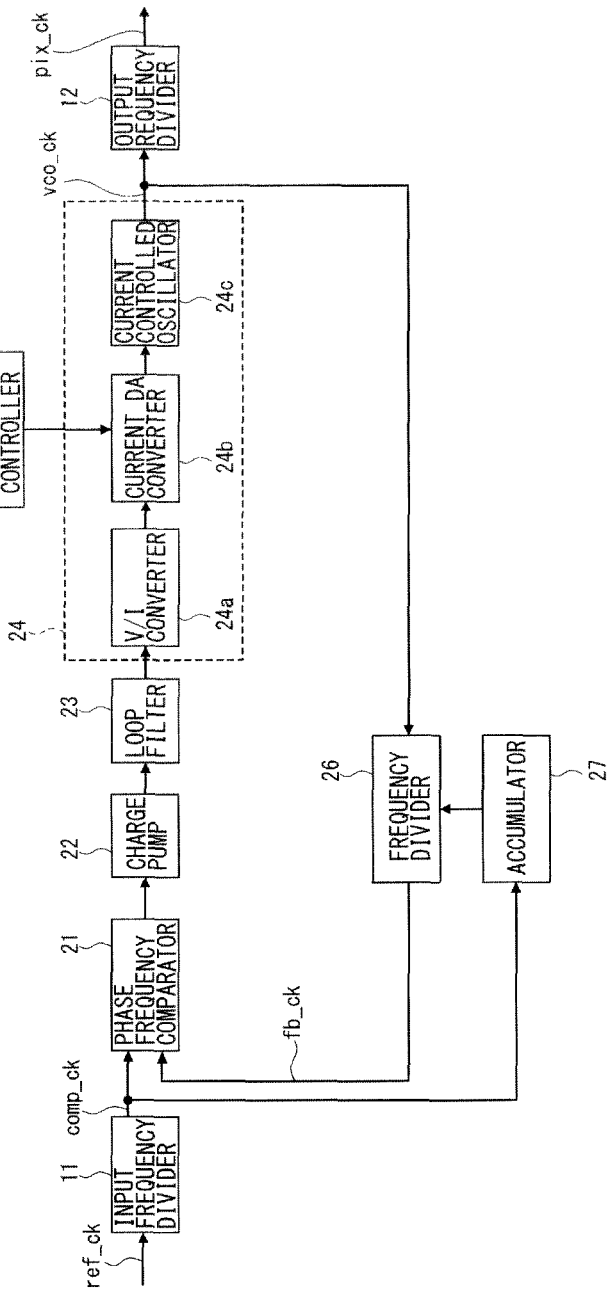
FIG. 17 is a block diagram of a prior art spread spectrum clock generator.

FIG. 16 is an enlarged view of a decrease in the phase shift amount Δph in FIG. 14. During the first sub step interval div_p the phase shift amount Δph is not changed. During the second sub step interval div_p it is not changed from the first to the third modulation clocks puck(n) but is changed at the fourth modulation clock puck(n). During the third sub step interval div_p the phase shift amount is not changed at the first and second modulation clocks puck(n) and changed at the third and fourth modulation clocks puck(n). During the fourth sub step interval div_p the phase shift amount Δph is not changed at the first modulation clock puck(n) and changed at the second to fourth modulation clocks puck(n).

The spread spectrum clock generator according to the present embodiment can equivalently improve the resolution of SS modulation by modulating the step width for changing the phase shift amount Δph. Also, it can compensate the coarseness of the frequency step of the SS modulation of the output clock signal even with a large minimal multiple rate of the frequency. In comparison with FIG. 13, assumed that the loop response speed of the fractional PLL circuit is the same, the frequency of the output clock signal vco_ck fluctuates as indicated by the broken line in FIG. 13 when the phase shift amount Δph is changed as indicated by the solid line in FIG. 14. The fluctuation in the frequency is smoother in FIG. 14 than in FIG. 13. Thus, the SSCG according to the present embodiment can achieve the advantageous effects, especially when a set value div_puck of the division ratio of the phase selector 6 is small and the minimal multiple rate of the frequency is large.

The length of the step interval step_p and sub step interval div_p can be set by a register for example. In FIGS. 15, 16 the number of modulation clocks puck(n) to set the changed phase amount is increased in each sub step interval div_p of each step interval step_p. Therefore, as long as the length of the step interval step_p is equal to the square of that of the sub step interval div_p, no deficiency or excess of the modulation clocks puck(n) will occur. However, when the length of the step interval step_p is shorter than the square of that of the sub step interval div_p, the phase shift amount Δph is switched to the changed phase amount after completion of the current step interval step_p. When the length of the step interval step_p is longer than the square of that of the sub step interval div_p, the phase shift amount Δph is switched to the changed phase amount after the modulation clocks puck(n) equivalent to the square of the length of the sub step interval div_p.

Moreover, in changing the phase shift amount Δph, the phase shift amounts before and after the change, i.e., time t1, t2, t3 in FIGS. 15 to 16 are set to predetermined values.

An example of deciding the length of a sub step interval div_p is described. In FIGS. 15 to 16 the length of the sub step interval div_p is preset, however, it can be automatically calculated from other set values.

The step size Δθ or resolution of the phase shift amount Δph is expressed by the following equation (28):

$$\Delta\theta = 1/\{(div\_pll+1)*(div\_puck+1)*512 + pll\_frac\} \approx$$
$$1/\{(div\_pll+1)*(div\_puck+1)*512\} \ldots (pll\_frac \leq 512)$$

The step number Δθs is expressed by the following equation (29):

$$\Delta\theta s = 2*int(ss\_amp/1024/\Delta\theta)$$

The step interval step_p and the sub step interval div_p are calculated as follows:

$$step\_p = int(ssint/\Delta\theta s/2) \quad (30)$$

$$div\_p = int(\sqrt{step\_p}) \quad (31)$$

For example, when ss_amp=5, div_pll=2, div_puck=3, div_fb=1, pll_frac=0, fpix_ck=40 MHz, and ssint=1,000, the sub step interval div_p is calculated as follows:

$$\Delta\theta = 1/\{(2+1)*(3+1)*512\} = 1/(6*1024) \quad (32)$$

$$\Delta\theta s = 2*int\{5/1024/(1/(6*1024))\} = 2*int(5*6) = 60 \quad (33)$$

$$fpuck = 40MHz/(3+1) = 10 \text{ MHz} \quad (34)$$

$$step\_p = int(1000/60/2) = 8 \quad (35)$$

$$div\_p = int(\sqrt{8}) = 2 \quad (36)$$

The modulation frequency is found to be 10 MHz/1,000=10 kHz from the modulation cycle ssint=1,000 and the frequency fpuck of the modulation clock puck(n)=10 MHz.

Alternatively, multiple step intervals step_p can be used. Another step interval step_p' can be calculated by the following equation:

$$step\_p' = step\_p + 1 \quad (37)$$

The phase selector 6 can use either the step interval step_p or step_p'.

Furthermore, the phase selector 6 can be configured to equally divide one cycle of the output clock signal vco_ck into a different number of phases instead of 512. The duty cycle of the output clock signal vco_ck and the phase shift clock signal pi_out can be different from the ones shown in FIGS. 4, 6, 8, and 10.

The phase selector divides the output clock signal so that the resolution of the fractional PLL circuit can be improved.

Although the present invention has been described in terms of exemplary embodiments, it is not limited thereto. It should be appreciated that variations or modifications may be made in the embodiments described by persons skilled in the art without departing from the scope of the present invention as defined by the following claims.

What is claimed is:

1. A spread spectrum clock generator comprising:
    a phase comparator configured to detect a phase difference between a reference input clock signal and a feedback signal and output a control voltage in line with the phase difference;
    a voltage controlled oscillator configured to generate an output clock signal with a frequency in line with the control voltage;
    a phase selector configured to equally divide one cycle of the output clock signal into a predetermined number of phases and select any of the phases, generate a phase shift clock signal having a rising edge at the selected phase, and transmit the phase shift clock signal to the phase comparator as the feedback signal;
    a phase controller configured to
    decide a phase of the rising edge of the phase shift clock signal so that the phase shift clock signal has a cycle different from the cycle of the output clock signal by a first phase shift amount and control the phase selector to select the decided phase, and
    generate a second phase shift amount which cyclically varies in a predetermined range, decide the rising edge of the phase shift clock signal to add the second phase shift amount to the first phase shift amount and subject the output clock signal to spread spectrum modulation by the cyclically varying second phase shift amount.

2. A spread spectrum clock generator according to claim 1, wherein
    the phase controller is configured to discretely change the second phase shift amount by repeatedly switching phase shift amounts before and after the change so that the changed phase shift amount is gradually increased.

3. A spread spectrum clock generator according to claim 1, wherein
    the spread spectrum clock generator operates as a fractional PLL circuit by varying the cycle of the phase shift clock signal from that of the output clock signal by the first phase shift amount.

4. A spread spectrum clock generator according to claim 1, further comprising
    a frequency divider configured to divide the phase shift clock signal to transmit the divided phase shift clock signal as the feedback signal to the phase comparator.

5. A spread spectrum clock generator according to claim 1, wherein
    the phase controller is configured to decide the phase of the rising edge of the phase shift clock signal so that the phase shift clock signal has a cycle different by a predetermined phase shift amount from that of a predetermined number of clocks of the output clock signals.

* * * * *